United States Patent

[11] 3,617,376

[72] Inventor Norman C. Miller
Woodland Hills, Calif.
[21] Appl. No. 623,531
[22] Filed Mar. 16, 1967
[45] Patented Nov. 2, 1971
[73] Assignee North American Rockwell Corporation

[54] ANTISUBLIMATION COATING AND METHOD FOR THERMOELECTRIC MATERIALS
10 Claims, No Drawings

[52] U.S. Cl. .......... 117/221, 117/17, 117/93.1 PF, 117/160 R, 117/223, 136/206, 136/238
[51] Int. Cl. .......... B44d 1/097, C23c 13/00, H01v 1/00
[50] Field of Search .......... 117/221, 223, 223 E, 219, 93.1, 105.2, 224, 224 E; 136/206, 238

[56] References Cited

UNITED STATES PATENTS

| | | | |
|---|---|---|---|
| 3,130,084 | 4/1964 | Loring | 136/206 |
| 3,170,813 | 2/1965 | Duncan et al. | 117/93.1 X |
| 3,368,920 | 2/1968 | Hagenlocher | 117/221 |
| 3,388,001 | 6/1968 | Blum et al. | 117/105.2 X |

*Primary Examiner*—Alfred L. Leavitt
*Assistant Examiner*—Thomas E. Bokan
*Attorneys*—William R. Lane and H. Fredrick Hamann

ABSTRACT: A protective ceramic composition and method for protecting thermoelectric elements, particularly those which are tellurium-containing, from sublimation. A thin coating of a metal oxide having the formula $M_2XO_3$ is applied to the thermoelectric material, wherein M is an alkali metal and X is a Group IVB metal (Ti, Zr, Hf). Further electrical connection of copper straps may be made to the thermoelectric element contact caps by brazing in a reducing atmosphere thereby reducing at least a portion of the $M_2XO_3$ to $M_2XO_2$.

ANTISUBLIMATION COATING AND METHOD FOR THERMOELECTRIC MATERIALS

BACKGROUND OF THE INVENTION

The present invention relates to a protective ceramic composition and method for protecting thermoelectric elements, particularly from sublimation.

Thermoelectric materials have the ability to convert heat directly to electricity without conventional rotating machinery. Thermoelectric generators employing such materials are highly desirable power sources for portable and remote applications. This is particularly the case where the power and life requirements of the generator are such as to make batteries, solar cells, or other electrical generators less attractive due to higher weight-to-power ratios, fuel requirements, noise, or other undesirable characteristics under severe environmental conditions. Thermoelectric materials are well known to the part and include such materials as germanium-silicon, zinc-antimony, copper-silver-selenium, bismuth telluride, lead telluride, germanium-bismuth telluride, tin telluride, lead-tin telluride, and Chromel-constantin.

A thermoelectric converter assembly generally comprises an array of thermoelectric elements, alternately doped with n-type and P-type dopants, with electrical contacts joined thereto. One side of the element is connected to a hot junction in communication with a heat source, and the other side of a cold junction in communication with a heat sink such as an environmental radiator. The temperature differential impressed across the thermoelectric material serves to generate a voltage, in accordance with the Seebeck effect.

Certain characteristics of the thermoelectric materials create difficulties when they are utilized at high temperatures and/or under vacuum. Principal among these is the tendency of thermoelectric materials, especially the tellurides, to sublime under such conditions, resulting in either severe power degradation or eventual total loss of electrical continuity. For example, changes in the doping level may result from sublimation. Also, the transport of thermoelectric material from the hot junction reduces the area of electrical contact. Moreover, other components, such as current-carrying leads and insulators in the vicinity of the thermoelectric material, are attacked and short-circuited by telluride vapor. It is further believed that the retention of telluride vapor within the thermoelectric body would aid in the healing of cracks or other defects that may occur as a result of thermal or mechanical shock.

Various encapsulating methods have heretofore been employed, with varying degrees of success, to prevent sublimation while not degrading thermal or electrical properties. Among these methods are vapor deposition of ceramics, electrophoric deposition of ceramics, metal sleeves, and coating with heat-cured cements. All such methods have drawbacks in one or more respects, including cracking, mismatch of thermal expansion characteristics, poisoning of thermoelectric materials, and failure to prevent or appreciably minimize sublimation.

The principal object of the present invention, accordingly, is to provide an improved composition and method for the protection of thermoelectric elements under severe environmental conditions.

Another object is to provide a compatible composition and method for preventing sublimation of thermoelectric materials, especially those containing tellurium, at high temperatures and/or under vacuum.

Another object is to provide a ceramic encapsulant for thermoelectric elements having good adherence characteristics and a matching thermal expansion coefficient, which will greatly minimize sublimation of the elements under severe environmental conditions and will not significantly affect the thermal or electrical properties of the thermoelectric material.

The foregoing and other objects and advantages of the present invention will become apparent from the following detailed description and the appended claims.

SUMMARY OF THE INVENTION

In accordance with the present invention there is provided a method for minimizing sublimation of a thermoelectric material under severe environmental conditions which comprises applying onto the thermoelectric material a thin coating of a metal oxide having the formula $M_2XO_3$, wherein M is an alkali metal and X a Group IVB metal (Ti, Zr, Hf).

The present $M_2XO_3$ compounds are found to be unique ceramic materials for protecting thermoelectric materials, and are characterized by high thermal expansion coefficients. For example, lithium titanate, the single preferred species, has a linear coefficient of expansion of 19–21 in./in./°C.($\times 10^{16}$), which is very much higher than that for other ceramics and corresponds reasonably well with those of the high-expansion thermoelectric materials. In particular, the expansion coefficients of $M_2XO_3$ compounds match those of the high expansion telluride thermoelectric materials such as PbTe and PbSnTe (PbTe=18–22 in./in./°C.($\times 10^{16}$)). Other very satisfactory $M_2XO_3$ compounds are $Na_2TiO_3$ and $Na_2ZrO_3$.

The melting points of $M_2XO_3$ compounds are sufficiently low so that they may be applied directly onto the thermoelectric element without serious thermal shock thereto, by such means as plasma spraying. Moreover, $M_2XO_3$ is chemically compatible with the thermoelectric materials, and it adheres in a continuous layer without a need for any carrier, binder or matrix material, to the thermoelectric materials and to electrical contacts such as iron and ferrous alloys.

DESCRIPTION OF THE PREFERRED EMBODIMENTS

Thermoelectric elements coated with the lithium titanate coating have been operated in excess of 18,000 hours at 850° F., and in excess of 4000 hours at 1000° F., all with success. The lithium titanate and the other $M_2XO_3$ coatings are not continuous as applied, but rather slightly porous and are not intended to be hermetic sealants. The present coatings repress sublimation by several orders of magnitude.

After the thermoelectric materials are coated, they are mounted into a thermoelectric module and the individual elements electrically connected, by such known means as copper straps. The electrical connection of the copper straps to the element contact caps is ordinarily made by brazing in a hydrogen (reducing) atmosphere. This results in reduction of at least some $M_2XO_3$ to $M_2XO_2$ (e.g., titanate to titanite), with certain other beneficial effects. Among the postulated benefits are improved adherence and mechanical integrity of the coating. Further, it appears that the reduced form of the coating is a "getter" for oxygen. It has been observed in the operating thermoelectric modules utilizing the present coating that lithium titanite scavenges oxygen and returns to the higher titanate oxidation state, as evidenced by a distinct color change. This characteristic is very advantageous, because oxygen is a serious cause of degradation in long term operation of telluride elements. Additionally, greater latitude is provided in brazing methods and techniques than would ordinarily be possible with uncoated tellurides, since free sublimation of telluride vapor seriously affects brazing operations.

The thermoelectric element is ordinarily cleaned by abrasion prior to coating in order to provide a more adherent surface. Cleaning is preferably accomplished by such conventional means as grit blasting. The blasting should be performed very lightly, and accordingly, the equipment utilized is adjusted to give both minimum gas pressure and minimum abrasive flow. Electric contacts, such as ferrous alloy caps, are usually applied to the thermoelectric elements prior thermoelectric coating by the present method, and, therefore, when the elements are cleaned, attention is given to removing traces of thermoelectirc material from the side surface of the contact cap.

The $M_2XO_3$ powder (powder size about −140 to +325 mesh) may be applied onto the telluride thermoelectric material by various means known to the art, including vapor deposition, painting or dipping of a slurry, and plasma spraying. The most convenient and, accordingly, preferred method involves plasma spraying. The spraying is conducted in such a manner as to give the thinnest coat which will provide adequate coverage of the element, as viewed by magnification. The coating depth may satisfactorily vary while assuring satisfactory protection of the telluride element. It is found, though, that a coating which is too thick will spall off, whereas one which is too thin and does not provide satisfactory coverage of the element will not properly protect it. A highly satisfactory coat is about 0.001–0.0015 in. thick.

There may be thermal shock to the element, as judged by an increase in resistance of the coated element, if plasma spraying is conducted for too long a period or if the spray gun is positioned too close to the target (e.g., less than 4 in.). If care is exercised (e.g., spraying for only a few seconds no closer than about 4 in.), such resistance increase will not be greater than about 10 percent. The increased resistance will normally be cured by the subsequent steps in fabricating a thermoelectric module, for example, by the pressure and temperature applied during subsequent current-strap brazing.

The following examples are offered as preferred embodiments of the present invention and to illustrate the present invention in greater detail.

EXAMPLE 1

PbTe-N-type and PbSnTe-P-type thermoelectric elements were hot-pressed to give elements having the dimensions about three eighth in. square and 0.22 in. long. These were then capped with iron-coated stainless steel caps, and the elements lightly grit blasted.

The elements were next mounted in an apparatus which was set to rotate at 1 to 3 revolutions per second. A commercial plasma gun was utilized to spray $Li_2TiO_3$ onto the side surfaces of the elements and the caps while rotating to a thickness of about 0.001–0.0015 in. The spraying parameters were:

| | |
|---|---|
| Powder size: | −140 to +325 mesh |
| Gas type: | argon |
| Plasma gas flow: | 30% |
| Powder gas flow: | 70% |
| Current: | 350 amperes |
| Distance: | 5–6 inches |
| Time: | 1½–3 seconds |

The coated thermoelectric elements were subsequently assembled into a thermoelectric module by methods which included attaching copper straps to the stainless steel caps by brazing with a commercially available braze (Premabraz 615-61½ percent Ag, 24 percent Cu, 14½ percent In) in a hydrogen atmosphere. Sixteen similarly coated elements were connected in a single series-connected array. This array was satisfactorily operated for more than 3,200 hours at 950° F. average hot junction temperature at ⅓ atmospheric pressure of argon. Another array, essentially similar, was operated satisfactorily at 1000° F. in a vacuum of $10^{15}$ Hg for more than 4000 hours, thus testifying to the effectiveness of the coating.

EXAMPLE 2

The procedure of example 1 is followed, except that the coating material is $Na_2ZrO_3$ powder, and similar satisfactory results are obtained.

EXAMPLE 3

The procedure of example 1 is followed, with the exception that the coating powder is of $Na_2TiO_3$, and satisfactory protection is likewise obtained.

The foregoing examples should not be taken as more than illustrative of the present invention, which should be understood to be limited only as is indicated in the appended claims.

I claim:

1. A thermoelectric article comprising a thermoelectric material coated with a protective coating of the metal oxide $M_2XO_3$ wherein M is an alkali metal and X is a metal selected from the group consisting of titanium, zirconium and hafnium.

2. The article of claim 1 wherein the thermoelectric material is tellurium-containing.

3. The article of claim 1 wherein the coating is of lithium titanate, and the thermoelectric material is selected from the class consisting of of lead telluride and lead-tin telluride.

4. A thermoelectric article comprising a lead telluride thermoelectric material coated with a protective layer of about 0.001–0.0015 in. lithium titanate.

5. A method of protecting a thermoelectric material from sublimation, which comprises applying onto the surface of said thermoelectric material a powder of the metal oxide $M_2XO_3$, wherein M is an alkali metal and X is a metal selected from the group consisting of titanium, zirconium and hafnium to form a coating on said surface.

6. The method of claim 5 wherein said $M_2XO_3$ powder is sprayed onto said thermoeletric material.

7. The method of claim 5 wherein said spraying is plasma-arc spraying.

8. A method of protecting a tellurium-containing thermoelectric material from sublimation under severe environmental conditions which comprises plasma-arc spraying lithium titanate powder onto said thermoelectric material to form a coating thereon having a thickness of about 0.001–0.0015 in.

9. The method of claim 8 wherein said lithium titanate powder is of a mesh size of about −140 to +325, and said tellurium-containing thermoelectric material is selected from the class consisting of lead telluride and lead-tin telluride.

10. A method of protecting a tellurium-containing thermoelectric material from sublimation under severe environmental conditions which comprises plasma-arc spraying lithium titanate powder onto said thermoelectric material to form a coating thereon having a thickness of about 0.001–0.0015 in. an then making electrical connection to said material wherein said material is heated in a reducing atmosphere thereby reducing at least a portion of said titanate to titanite.